(12) United States Patent
Hsieh

(10) Patent No.: US 9,973,332 B2
(45) Date of Patent: May 15, 2018

(54) CLOCK AND DATA RECOVERY APPARATUS AND METHOD OF THE SAME

(71) Applicant: Realtek Semiconductor Corporation, Hsinchu (TW)

(72) Inventor: Hong-Yean Hsieh, Sunnyvale, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days. days.

(21) Appl. No.: 15/413,434

(22) Filed: Jan. 24, 2017

(65) Prior Publication Data

US 2017/0180112 A1    Jun. 22, 2017

Related U.S. Application Data

(62) Division of application No. 14/972,023, filed on Dec. 16, 2015, now Pat. No. 9,590,640.

(51) Int. Cl.

| H04L 7/02 | (2006.01) |
|---|---|
| H03K 5/135 | (2006.01) |
| H03L 7/091 | (2006.01) |
| H03L 7/08 | (2006.01) |
| H03K 19/21 | (2006.01) |
| H03L 7/093 | (2006.01) |
| H03L 7/107 | (2006.01) |

(Continued)

(52) U.S. Cl.
CPC ............. *H04L 7/02* (2013.01); *H03K 5/135* (2013.01); *H03K 19/21* (2013.01); *H03L 7/0807* (2013.01); *H03L 7/091* (2013.01); *H03L 7/093* (2013.01); *H03L 7/1075* (2013.01); *H03L 7/18* (2013.01); *H03K 2005/00052* (2013.01); *H03L 2207/50* (2013.01)

(58) Field of Classification Search
CPC ....... H03L 7/0998; H03L 7/091; H03L 7/107; H03L 7/089; H03L 7/081; H04L 7/0025; H04L 7/033; H04L 7/0337
See application file for complete search history.

(56) References Cited

U.S. PATENT DOCUMENTS

| 7,486,747 B1 | 2/2009 | Bagley et al. |
| 8,180,012 B1 * | 5/2012 | Do .......................... H04L 7/033 375/371 |

(Continued)

*Primary Examiner* — Aristocratis Fotakis
(74) *Attorney, Agent, or Firm* — CKC & Partners Co., Ltd.

(57) ABSTRACT

An electronic apparatus including a PLL unit to an original clock signal, a pair of phase interpolators, a sampler, a phase detector, a control unit and a loop filter is provided. The phase interpolators receive the original clock signal and generate a reference clock signal and an auxiliary clock signal offset by 90 degrees having transition edges. The sampler samples an input data signal at each of the transition edge. The phase detector determines a phase difference of a data transition of the input data signal relative to the reference clock signal. The control unit superimposes an adjusting phase on phases of the reference clock signal and the auxiliary clock signal according to the phase difference. The phase detector determines that the phase difference is within a predetermined range. The loop filter superimposes a varying phase on the phases of the reference clock signal and the auxiliary clock signal accordly.

18 Claims, 5 Drawing Sheets

(51) Int. Cl.
  *H03L 7/18*  (2006.01)
  *H03K 5/00*  (2006.01)

(56) References Cited

U.S. PATENT DOCUMENTS

| | | | |
|---|---|---|---|
| 8,415,996 B1* | 4/2013 | Wong | H03L 7/0807 |
| | | | 327/152 |
| 9,407,424 B1* | 8/2016 | Holla | H04L 7/0337 |
| 2004/0170244 A1* | 9/2004 | Cranford, Jr. | H03L 7/07 |
| | | | 375/373 |
| 2006/0062341 A1 | 3/2006 | Edmondson et al. | |
| 2007/0047683 A1 | 3/2007 | Okamura et al. | |
| 2009/0086872 A1* | 4/2009 | Liu | H03L 7/0814 |
| | | | 375/371 |
| 2009/0256629 A1 | 10/2009 | Tseng et al. | |
| 2010/0097071 A1* | 4/2010 | Lee | G01R 31/31709 |
| | | | 324/537 |
| 2012/0062291 A1* | 3/2012 | Saitoh | H04L 7/033 |
| | | | 327/157 |
| 2012/0224657 A1 | 9/2012 | Sasaki et al. | |
| 2013/0091392 A1* | 4/2013 | Valliappan | H04L 7/0331 |
| | | | 714/700 |
| 2013/0216014 A1* | 8/2013 | Kong | H03L 7/07 |
| | | | 375/376 |
| 2016/0013927 A1 | 1/2016 | Lee et al. | |

* cited by examiner

CLOCK AND DATA RECOVERY APPARATUS AND METHOD OF THE SAME

RELATED APPLICATIONS

This application is a division of U.S. application Ser. No. 14/972,023, filed Dec. 16, 2015, which is herein incorporated by reference.

BACKGROUND

Field of Invention

The present disclosure relates to a clock and data recovery technology, and, particularly, to a clock and data recovery apparatus and method of the same.

Description of Related Art

Burst-mode communication is mostly used in point-to-multipoint fiber access systems. Recently, burst-mode operations are also required in establishing a link in chip-to-chip communications to save power. The effectiveness of saving power depends on how quickly the links can be turned on and off. To turn the link on and off in accordance with the burst data dictates the clock and data recovery apparatus to reduce its lock time. However, it poses the biggest challenge to reduce lock time to within tens of bit times.

Accordingly, what is needed is a clock and data recovery apparatus and method of the same to address the above issues.

DETAILED DESCRIPTION

Figure 1:
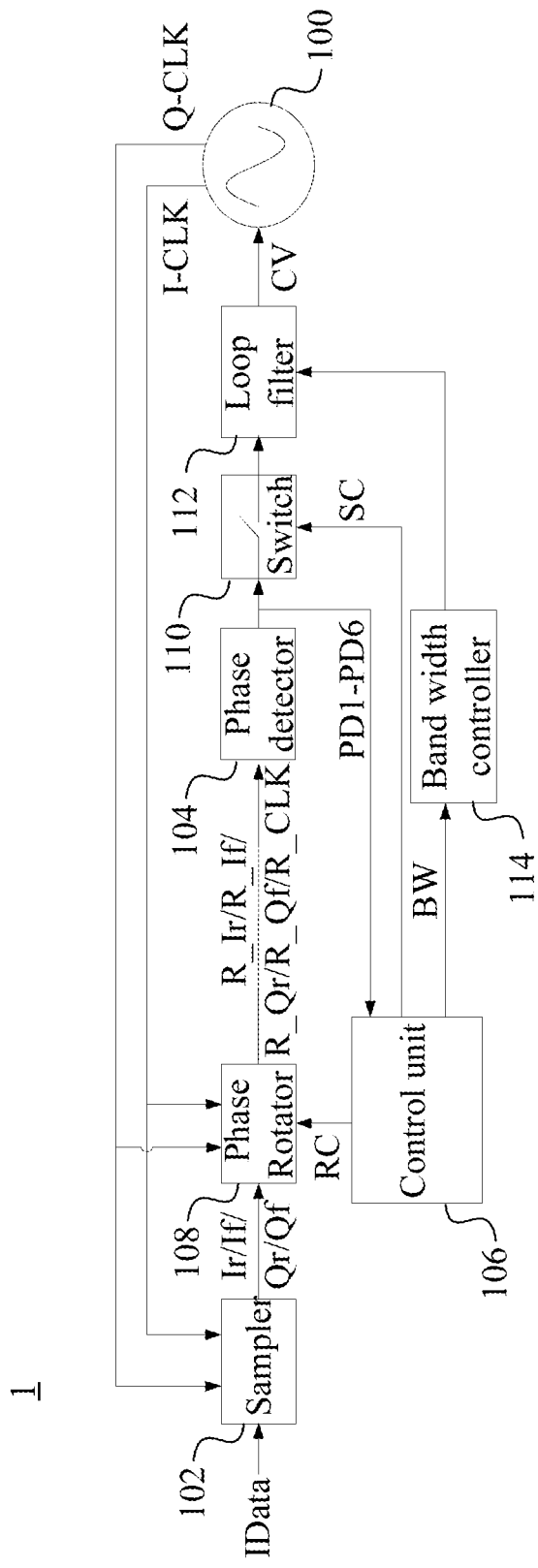
FIG. 1 is a block diagram of an electronic apparatus in an embodiment of the disclosure.

Referring to FIG. 1, a block diagram of an electronic apparatus 1 is illustrated. In an embodiment, the electronic apparatus 1 is a PLL-based clock and data recovery apparatus and includes an oscillator 100, a sampler 102, a phase detector 104, a control unit 106, a phase rotator 108, a switch 110 and a loop filter 112. In an embodiment, the oscillator 100 is a voltage-controlled oscillator and generates a reference clock signal I-CLK and an auxiliary clock signal Q-CLK Referring also to FIG. 2, a waveform diagram of signals transmitted in the electronic apparatus 1 is illustrated. The clock signals I-CLK and Q-CLK are offset by 90 degrees. The reference dock signal I-CLK includes a rising edge IRE and a falling edge IFE. The auxiliary clock signal Q-CLK includes a rising edge QRE and a falling edge QFE. These transition edges separate a period of the reference clock signal I-CLK into four parts each occupying a phase of 90 degrees. In an embodiment, the rising edge IRE is selected as a data-sampling edge.

The sampler 102 in FIG. 1 samples an input data signal IDATA at each transition edge of the clock signals I-CLK and Q-CLK so as to generate primary sampled signals Ir, If, Qr and Qf corresponding to the transition edges IRE, IFE, QRE and QFE respectively. The primary sampled signal Ir is a primary data-sampled signal corresponding to the data-sampling edge, i.e., the rising edge IRE.

Figure 3:
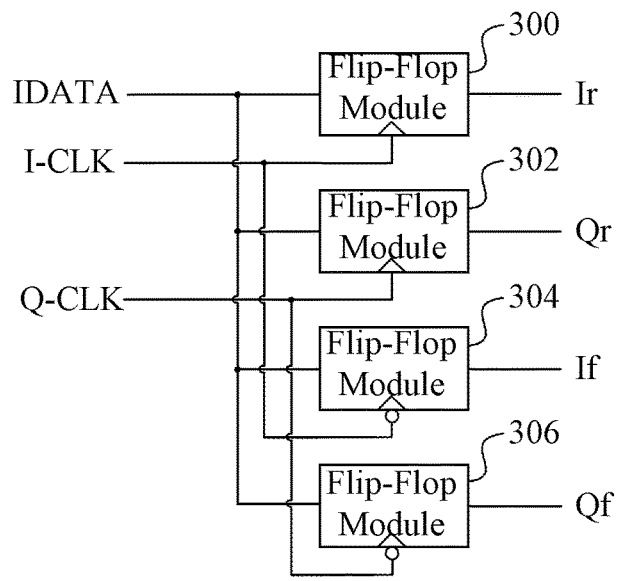
FIG. 3 is a block diagram of the sampler in an embodiment of the disclosure.

Referring to FIG. 3, a block diagram of the sampler 102 i rated, an embodiment, the sampler 102 includes flip-flop modules 300, 302, 304 and 306, each receiving and sampling the input data signal IDATA according to clock signals I-CLK and Q-CLK (particularly, to transition edges IRE, QRE, IFE and QFE) so as to generate the primary sampled signals Ir, Qr, If and Qf.

In an embodiment, as illustrated in FIG. 1, the phase rotator 108 is coupled between the sampler 102 and the phase detector 104, and bypasses the primary sampled signals Ir, If, Qr and Qf to the phase detector 104 in an initial state. The phase detector 104 determines a phase difference of a data transition of the input data signal IDATA, e.g., the data transition labeled as DT in FIG. 2, relative to the reference clock signal I-CLK.

Figure 4:
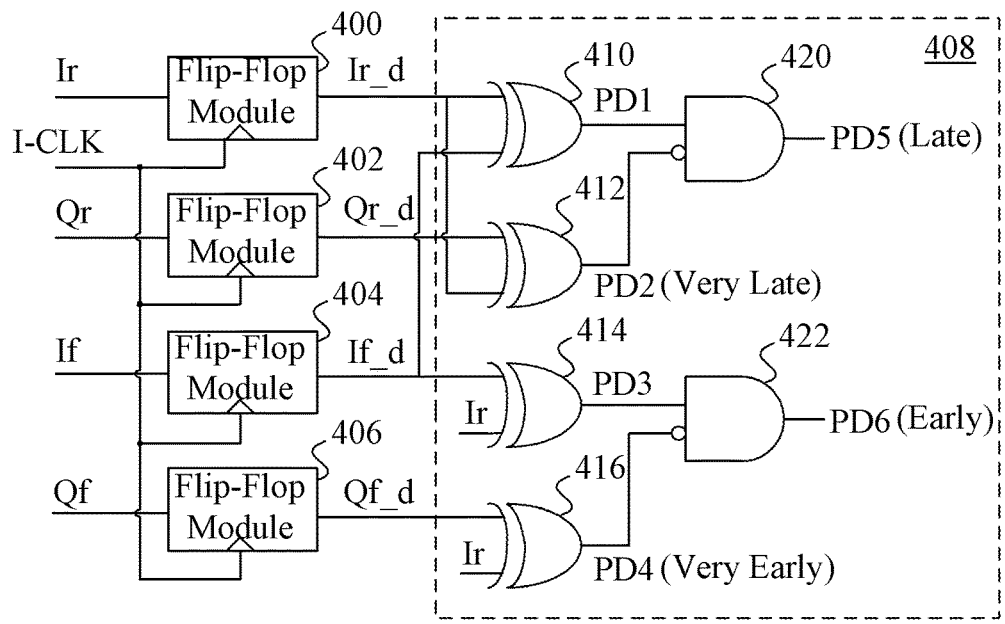
FIG. 4 is a block diagram of the phase detector in an embodiment of the disclosure.

Referring to FIG. 4, block diagram of the phase detector 104 is illustrated. In one embodiment, the phase detector 104 includes sampling units 400, 402, 404 and 406 and a logic module 408. The sampling units 400, 402, 404 and 406 sample the primary sampled signals Ir, If, Qr and Qf at the data-sampling edge of the clock signal I-CLK, i.e., the rising edge IRE, to generate secondary sampled signals Ir_d, If_d, Qr_d and Qf_d in FIG. 2.

The secondary sampled signal Ir_d is a secondary data-sampled signal Ir_d corresponding to the primary data-sampled signal Ir. According to the values of the secondary sampled signals Ir_d, If_d, Qr_d and Qf_d and the primary data-sampled signals Ir, it is available to determine the position of the data transition DT of the input data signal IDATA.

As a result, the logic module 408 performs logic operations to compare the secondary sampled signals Ir_d, If_d, Qr_d and Qf_d to at least one of the primary data-sampled signal Ir and the secondary data-sampled signal Ir_d to generate phase detected signals.

As illustrated in FIG. 4 the logic module 408 includes exclusive OR (XOR) gates 410, 412, 414, and 416 and AND gates 420 and 422.

The XOR gate 410 receives the secondary data-sampled signal Ir_d and the secondary sampled signal If_d to generate a phase detected signal PD1. The secondary sampled signal If_d corresponds to the primary sampled signal If sampled by the transition edge that lags the data-sampling edge by 180 degrees.

The XOR gate 412 receives the secondary data-sampled signal Ir_d and the secondary sampled signal Qr_d to generate a phase detected signal PD2. The secondary sampled signal Qr_d corresponds to the primary sampled signal Qr sampled by the transition edge that lags the data-sampling edge by 90 degrees.

The XOR gate 414 receives the primary data-sampled signal Ir and the secondary sampled signal If_d to generate a detected signal PD3. The secondary sampled signal If_d corresponds to the primary sampled signal If sampled by the transition edge that I the data-sampling edge by 180 degrees.

The XOR gate 416 receives the primary data-sampled signal Ir and the secondary sampled signal Qf_d to generate a phase detected signal PD4. The secondary sampled signal Qf_d corresponds to the primary sampled signal Qf sampled by the transition edge that lags the data-sampling edge by 270 degrees.

The AND gate 420 receives the phase detected signal PD1 and an inverted phase detected signal PD2 to generate a phase detected signal PD5.

The AND gate 422 receives the phase detected signal PD3 and an inverted phase detected signal PD5 to generate a phase detected signal PD6.

According to the combination of log c levels of the phase detected signals PD1-PD6, the phase difference of the data transition DT relative to the reference clock signal I-CLK can be obtained. In an embodiment, the phase difference of the data transition DT is expressed by four conditions relative to an edge-sampling edge (i.e., the falling edge IFE) that is distanced to the data-sampling edge IRE by 180 degrees.

Figure 5:
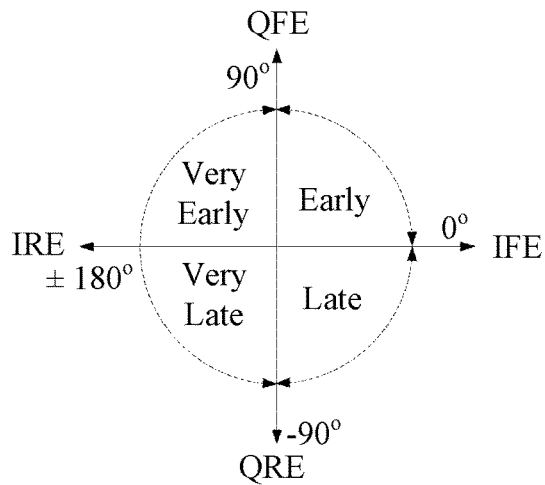
FIG. 5 is a diagram illustrating the range, of phases relative to the, transition edges in an embodiment of the disclosure.

Referring to FIG. 5, a diagram illustrating the range of phases relative to the transition edges IFE, QRE, IRE and QFE is provided. The four conditions include: (1)"Early" corresponding to a first quadrant that the falling edge IFE leads the data transition DT within 90 degrees, (2) "Very Early" corresponding to a second quadrant that the falling edge IFE leads the data transition DT within 90 degrees to 180 degrees, (3) "Late" corresponding to a fourth quadrant that the falling edge IFE lags the data transition DT within 90 degrees and (4) "Very Late" corresponding to a third quadrant that the falling edge IFE lags the data transition DT within 90 degrees to 180 degrees.

Figure 2:
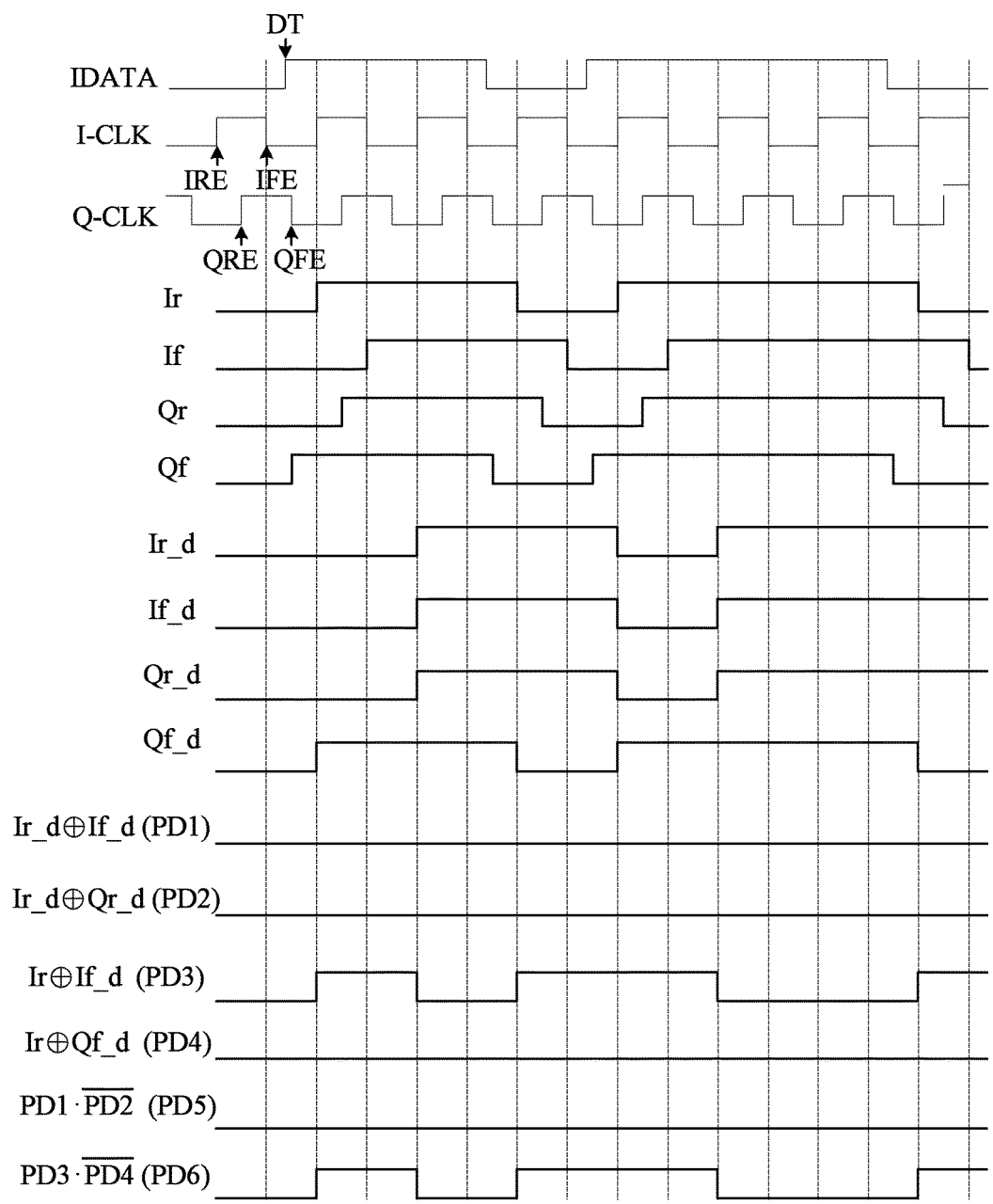
FIG. 2 is a waveform diagram of various signals transmitted in an electronic apparatus in an embodiment of the disclosure.

In an embodiment, the conditions mentioned are detected by logic levels of the phase detected signals PD1-PD6. When the phase detected signal PD6 has a non-low state, the condition is "Early". When the phase detected signal PD4 has a non-low state, the condition is "Very Early". When the phase detected signal PD5 has a non-low state, the condition is "Late". When the phase detected'signal PD2 has a non-low state, the condition is "Very Late". As shown in FIG. 2, the exemplary condition includes the non-low state of the phase detected signal PD6. As a result, the condition of "Early" is detected.

After the phase position of the data transition DT is determined, the control unit 106 receives t he phase detected signals PD1-PD6 and generates a rotation control signal RC accordingly. In an embodiment, only the phase detected signals PD2, PD4, PD5 and PD6 are necessary for the control unit 106 to generate the rotation control signal RC.

The phase rotator 108 receives the rotation control signal RC to rotate the primary sampled signals Ir, If, Qr and Qf and the reference clock signal I-CLK received by the phase detector 104 such that the phase detector 104 receives the rotated primary sampled signals R_Ir, R_If R_Qr and R_Qf and the rotated reference clock signal R_CLK. The object of the rotation is to make the phase difference between the data transition DT and a rotated reference clock signal R_CLK within a predetermined range, e.g. in the first and the fourth quadrants in FIG. 5.

Figure 6:
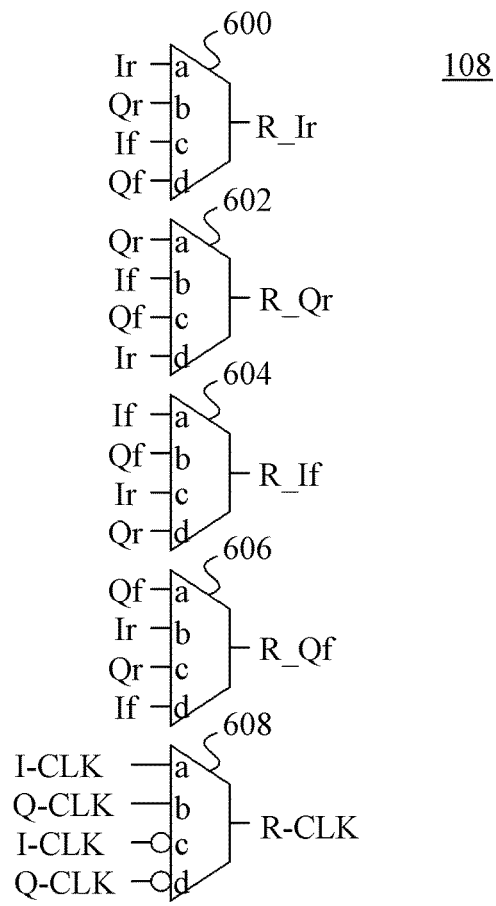
FIG. 6 is a block diagram of the phase rotator in an embodiment of the disclosure.

Referring to FIG. 6, a block diagram of the phase rotator 108 is illustrated. The phase rotator 108 includes sampled signal multiplexers 600, 602 604 and 606 and a clock multiplexer 608. Each of the sampled signal multiplexers 600, 602,604 and 606 receives the primary sampled signals Ir, If, Qr and Qf and outputs one of the primary sampled signals Ir, If, Qr and Qf according to the rotation control signal RC that indicates a phase to be rotated so as to generate the rotated primary sampled signals R_Ir, R_If, R_Qr and R_Qf.

In an embodiment, when the phase difference is within the predetermined range (i.e., the conditions of "Early" and "Late" corresponding to the first and the fourth quadrants), the phases of the primary sampled signals Ir, If, Qr and Qf do not need to be rotated. The rotation control signal RC controls the sampled signal multiplexers 600, 602, 604 and 606 to output the signals fed from the input port labeled as "a", which are the primary sampled signals Ir, Qr, If and Qf respectively.

In an embodiment, when the phase difference is not within the predetermined range and the falling edge IFE leads the data transition DT for 90 degrees to 180 degrees (i.e, the condition of "Very Early" corresponding to the second quadrant), the phases of the primary sampled signals Ir, If, Qr and Qf are rotated to be delayed by 90 degrees. The rotation control signal RC controls the sampled signal multiplexers 600, 602 604 and 606 to output the signals fed from the input port labeled as "b" (i.e., the primary sampled signals Qr, If, Qf, and Ir respectively), which is equivalent to delay these signals by 90 degrees.

In an embodiment, when the phase difference is not within the predetermined range and the falling edge IFE lags the data transition DT for 90 degrees to 180 degrees (i.e., the condition of "Very Late" corresponding to the third quadrant), the phases of the primary sampled signals Ir, If, Qr and Qf are rotated to be advanced by 90 degrees. The rotation control signal RC controls the sampled signal multiplexers 600, 602, 604 and 606 to output the signals fed from the input port labeled as "d" (i.e., the primary sampled signals Qf, Ir, Qr, and If respectively), which is equivalent to advance these signals by 90 degrees.

In an embodiment, when the phase difference is not within the predetermined range and the falling edge IFE either leads and lags the data transition DT for 90 degrees to 180 degrees(i.e., the condition of "Very Early" and "Very Late" corresponding to the second and the third quadrants), the phases of the primary sampled signals Ir, If, Qr and Qf are rotated to be either delayed or advanced by 180 degrees. The rotation control signal RC controls the sampled signal multiplexers 600, 602, 604 and 606 to output the signals fed from the input port labeled as "c" (i.e., the primary sampled signals If, Qf, Ir, and Qr respectively), which is equivalent to delay these signals by 180 degrees.

Similar to the mechanism mentioned above, the clock multiplexer 608 receives the clock signals I-CLK, Q-CLK, inverted I-CLK and inverted Q-CLK, and outputs one of them according to the rotation control signal RC so as to generate the rotated reference clock signal R-CLK. For illustration, the clock signals I-CLK, Q-CLK, inverted I-CLK and inverted Q-CLK are outputted according to the conditions that correspond to the port "a", "b", "c" and "d" respectively.

The control unit 106 further generates a switch control signal SC to control the switch 110 to be open-circuited before the "condition" is determined, and to control the switch 110 to be close-circuited to couple the phase detector 104 and the loop filter 112 as the "condition" is determined.

After the switch 110 couples the phase detector 104 and the loop filter 112, the loop filter 112 generates a control voltage CV to control the oscillator 100 to vary phases of the clock signals I-CLK and Q-CLK according to the "condition".

Since the phase difference is within the predetermined range after the, rotation, the phase difference only has two possible conditions, which are "Early" and "Later". When the loop filter 112 varies the phases of the reference clock signal and the auxiliary clock signal such that the phase difference shows that the rotated reference clock signal R-CLK switches between a leading and a lagging positions (i.e., between "Early" and "Late") relative to the data transition DT of the input data signal IDATA, the phase detector 104 detects a phase-locked condition. The edge-sampling edge (i.e., a falling edge) of the rotated reference clock R-CLK and the data transition DT of the input data signal DATA are aligned.

In an embodiment, the electronic apparatus 1 selectively includes a bandwidth controller 114. The control unit 106 further generates a bandwidth setting signal BW to control the bandwidth controller 114 so as to widen a bandwidth of the loop filter 112 when the switch 110 is controlled to be close-circuited. Further, the control unit 106 generates the bandwidth setting signal BW to adjust the bandwidth to an optimum value as the phase detector 104 detects the phase-locked condition.

As a result, the electronic apparatus 1 of the present disclosure reduces lock-in time because the rotation of the primary sampled data signals quickly narrows the range of the phase difference between the data transition and the edge-sampling edge, and further reduces the power consumption. Moreover, the dynamic control of the bandwidth of the loop filter 112 further reduces the lock-in time to within tens of bit times and achieves high jitter tolerance at higher jitter frequency.

Figure 7:
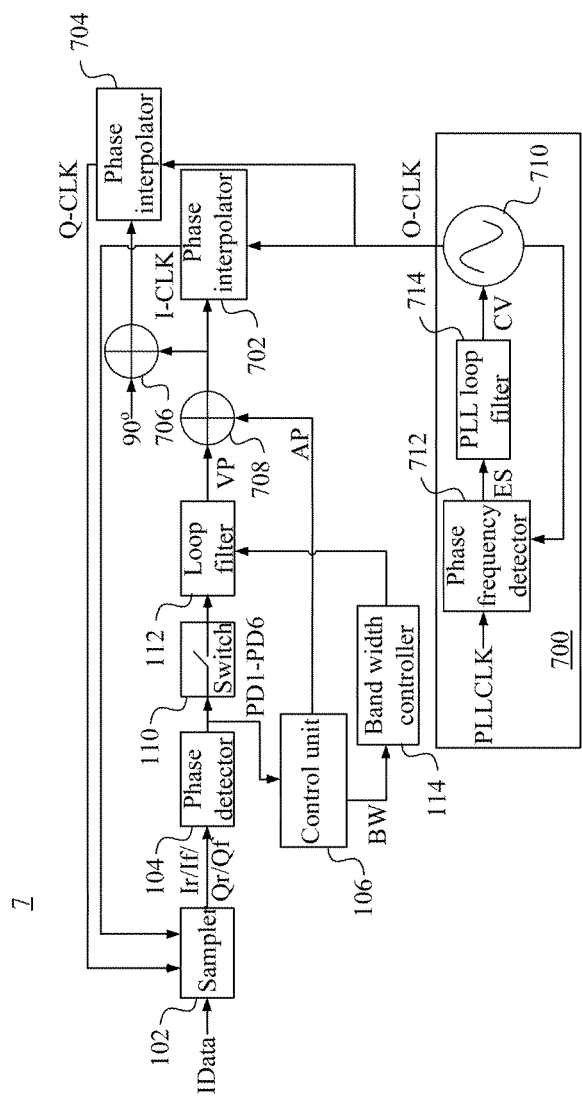
FIG. 7 is a block diagram of n electronic apparatus in an embodiment of the disclosure.

Referring to FIG. 7, a block diagram of an electronic apparatus 7 is illustrated. In an embodiment, the electronic apparatus 7 is a dual-loop clock and data recovery apparatus. Similar to the electronic apparatus 1, the electronic apparatus 7 includes a sampler 102, a phase detector 104, a control unit 106, a switch 110 and a loop filter 112 similar or identical to those illustrated in FIG. 1, thus the detail description of these elements are not described herein.

The electronic apparatus 7 includes a phase lock loop (PLL) unit 700 and a pair of phase interpolators 702 and 704. In an embodiment, the phase lock loop unit 700 includes an oscillator 710, a phase frequency detector 712 and a PLL loop filter 714.

The oscillator 710 generates an original clock signal O-CLK. The phase frequency detector 712 receives a PLL reference clock signal PLLCLK and the original clock signal O-CLK to generate an error signal ES. The PLL loop filter 714 receives the error signal ES to generate a control voltage CV to control the oscillator 710 to adjust a clock phase of the original clock signal O-CLK.

The phase interpolators 702 and 704 receive the original clock signal O-CLK and respectively generate the clock signals I-CLK and Q-CLK. In an embodiment, the phase interpolator 702 directly outputs the original clock signal O-CLK as the reference clock signal I-CLK. A phase adder 706 is presented to superimpose the phase of 90 degrees to the phase interpolator 704 such that the auxiliary clock signal Q-CLK is the reference clock signal I-CLK offset by 90 degrees.

The sampler 102 samples the input data signal DATA at each of he transition edges of the clock signals I-CLK and Q-CLK to generate the primary sampled signals Ir, If, Qr and Qf. The phase detector 104 determines the phase difference of the data transition DT of the input data signal IDATA relative to the edge-sampling edge IRE of the reference clock signal I-CLK based on the primary sampled signals Ir, If, Qr, Qf and the data-sampling edge IRE, in which the condition of the phase difference is expressed by the logic combination of the phase detected signals PD1-PD6.

In the present embodiment, the control unit 106 superimposes an adjusting phase AP on phases of the clock signals I-CLK and Q-CLK by using a phase adder 708 through the phase interpolators 702 and 704 when the phase difference is not within the predetermined range.

As a result, the phase detector 104 receives the adjusted primary sampled signals Ir, If Qr and Qf generated by the sampler 102 to determine the phase difference between the data transition and the adjusted reference clock signal.

The loop filter 112 superimposes a varying phase VP on the phases of the clock signals input to the phase interpolators 702 and 704 (further to the sampler 102) by using the phase adder 708 according to the phase difference. When the varying phases VP varies the phases of the clock signals input to the phase interpolators 702 and 704 such that the phase difference shows that the edge-sampling edge of the reference clock signal I-CLK switches between a leading position and a lagging position (i.e., between "Early" and "Late") relative to the data transition DT of the input data signal IDATA, the phase detector 104 detects the phase-locked condition.

As a result, the superimposition of the phases is used to quickly narrow the range of the phase difference between the data transition, and the data-sampling edge. Both of the lock-in time and the power consumption can be reduced.

Although the present invention has been described in considerable detail with reference to certain embodiments thereof, other embodiments are possible. Therefore, the spirit and scope of the appended claims should not be limited to the description of the embodiments contained herein.

What is claimed is:

1. An electronic apparatus comprising:
a phase lock loop (PLL) unit, generating an original dock signal;
a pair of phase interpolators, receiving the original dock signal and respectively generate a reference dock signal and an auxiliary clock signal offset by 90 degrees and having transition edges, wherein one of the transition edges is a data-sampling edge;
a sampler, sampling an input data signal at each of the transition edges to generate a plurality of primary sampled signals;
a phase detector, determining a phase difference of a data transition of the input data signal relative to the reference clock signal by comparing each of the primary sampled signals with the data-sampling edge,
a control unit, superimposing an adjusting phase on, phases of he reference clock signal and the auxiliary clock signal through the phase interpolators according to the phase difference, such that the phase detector receives the adjusted primary sampled signals generated by, the sampler to determine that the phase difference between the data transition and the adjusted reference clock signal is within a predetermined range; and
a loop filter, superimposing a varying phase on the phases of the reference clock signal and the auxiliary dock signal through the phase interpolators according to the phase difference.

2. The electronic apparatus of claim 1, wherein the primary sampled signals comprises a primary data-sampled signal sampled by the data-sampling edge, and the phase detector comprises:
a plurality of sampling units, sampling the primary sampled signals at the data-sampling edge to generate plurality of secondary sampled signals comprising a secondary data-sampled signal corresponding to the primary data-sampled signal; and a logic module, performing logic operations to compare the secondary sampled signals to at least one of the primary data-sampled signal and the secondary data-sampled signal, to generate a plurality of phase detected signals;

wherein a condition of the phase difference is expressed by a combination of logic levels of the phase detected signals.

3. The electronic apparatus of claim 2, wherein the logic module comprises:

a first exclusive OR (XOR) gate, receiving the secondary data-sampled signal and one of the secondary sampled signals corresponding to one of the primary sampled signals sampled by one of the transition edges that lags the data-sampling edge by 180 degrees to generate a first phase detected signal;

a second XOR gate, receiving the secondary data-sampled signal and one of the secondary sampled signals corresponding to one of the primary sampled signals sampled by one of the transition edges that lags the data-sampling edge by 90 degrees, to generate a second phase detected signal;

a third XOR gate, receiving the primary data-sampled signal and one of the secondary sampled signals corresponding to one of the primary sampled signals sampled by one of the transition edges that lags the data-sampling edge by 90 degrees, to generate a third phase detected signal;

a fourth XOR gate receiving the primary data-sampled signal and one of the secondary sampled signals corresponding to one of the primary sampled signals sampled by one of the transition edges that lags the data-sampling edge by 270 degrees to generate a fourth phase detected signal;

a first AND gate, receiving the first phase detected signal and an inverted second phase detected signal to generate a fifth phase detected signal; and a second AND gate, receiving the third phase detected signal and an inverted fourth phase detected signal to generate a sixth phase detected signal.

4. The electronic apparatus of claim 3, wherein when the second phase detected signal or the fourth phase detected signal has a non-low state, the phase difference between the data transition of the input data signal and the reference clock signal is determined to be not within the predetermined range.

5. The electronic apparatus of claim 1, further comprising, a switch, wherein the control unit further generates a switch control signal to control the switch to be open-circuited before the phase difference is determined to be within the predetermined range, or to be close-circuited to couple the phase detector and the loop filter as the phase difference is determined to be within the predetermined range.

6. The electronic apparatus of claim 5, further comprising bandwidth controller, wherein the bandwidth controller widens a bandwidth of the loop filer as the switch is controlled to be close-circuited and reduces the bandwidth as the phase detector detects a phase-locked condition.

7. The electronic apparatus of claim 1, wherein when the varying phases varies the phases of the of the reference clock signal and the auxliary clock signal such that the phase difference shows that the reference clock signal switches between a leading position and a lagging position relative to the data transition of the input data signal, the phase detector detects a phase-locked condition.

8. The electronic apparatus of claim 1, wherein the PLL unit comprises, an oscillator, generating the original clock signal;

a phase frequency detector, receiving a PLL reference clock signal and the original clock signal to generate an error signal; and a PLL loop filter, receiving the error signal to generate a control voltage to control the oscillator to adjust a clock phase of the original clock signal.

9. The electronic apparatus of claim 1, wherein the phase difference is the difference between the phases of the data transition of the input data signal relative to an edge-sampling edge of the reference clock signal that is distanced to the data-sampling edge by 180 degrees.

10. A method comprising:

generating an original dock signal;

generating a reference dock signal and an auxiliary clock signal offset by 90 degrees and having transition edges based on the original clock signal, wherein one of the transition edges is a data-sampling edge;

sampling a input data signal at each of the transition edges to generate a plurality of primary sampled signals;

determining a phase difference of a data transition of the input data signal relative to the reference clock signal by comparing each of the primary sampled signals with the data-sampling edge, superimposing an adjusting phase on phases of the reference clock signal and the auxiliary clock signal through the phase interpolators according to the phase difference and determining that the phase difference between the data transition and the adjusted reference clock signal is within a predetermined range; and superimposing a varying phase on the phases of the reference clock signal and the auxiliary clock signal according to the phase difference.

11. The method of claim 10, wherein the primary sampled signals comprises a primary data-sampled signal sampled by the data-sampling edge, and the step of determining the phase difference further comprises:

sampling the primary sampled signals at the data-sampling edge to generate a plurality of secondary sampled signals comprising a secondary data-sampled signal corresponding to the primary data-sampled signal; and performing logic operations to compare the secondary sampled signals to at least one of the primary data-sampled signal and the secondary data-sampled signal to generate a plurality of phase detected signals;

wherein a condition of the phase difference is expressed by a combination of logic levels of the phase detected signals.

12. The method of claim 11, wherein the step of p the logic operations further comprises:

receiving the secondary data -sampled signal and one of the secondary sampled signals corresponding to one of the primary sampled signals sampled by one of the transition edges that lags the data-sampling edge by 180 degrees, to perform a first XOR operation to generate a first phase detected signal;

receiving the secondary data-sampled signal and one of the secondary sampled signals corresponding to one of the primary sampled signals sampled by one of the transition edges that lags the data-sampling edge by 90 degrees, to perform a second XOR operation to generate a second phase detected signal;

receiving the primary data-sampled signal and one of the secondary sampled signals corresponding to one of the primary sampled signals sampled by one of the transition edges that lags the data-sampling edge by 90 degrees, to perform a third XOR operation to generate a third phase detected signal;

receiving the primary data-sampled signal and one of the secondary sampled signals corresponding to one of the primary sampled signals sampled by one of the transition edges that lags the data-sampling edge by 270 degrees, to perform a fourth XOR operation to generate a fourth phase detected signal;

receiving the first phase detected signal and an inverted second phase detected signal to perform a first AND operation to generate a fifth phase detected signal; and receiving the third phase detected signal and an inverted fourth phase detected signal to perform a second AND operation to generate a sixth phase detected signal.

13. The method of claim 12, wherein when the second phase detected signal or the fourth phase detected signal has a non-low state, the phase difference between the data transition of the input data signal and the reference clock signal is determined to be not within the predetermined range.

14. The method of claim 10, further comprising:
not superimposing the varying phase before the phase difference is determined to be within the predetermined range; and
superimposing the varying phase as the phase difference is determined to be within the predetermined range.

15. The method of claim 14, further comprising:
widening a bandwidth related to the superimposition of the varying phase as the phase difference is determined to be within the predetermined range; and
reducing the bandwidth as a phase-locked condition is detected based on the phase difference.

16. The method of claim 10, wherein when the varying phases varies the phases of the of the reference dock signal and the auxiliary clock signal such that the phase difference shows that the reference dock signal switches between a leading position and a lagging position relative to the data transition of the input data signal, a phase-locked condition is detected.

17. The method of claim 10, wherein the step of generating the original clock signal further comprises:
generating the original clock signal;
receiving a PLL reference clock signal and the original clock signal to generate an error signal; and
receiving the error signal to generate a control voltage to control the oscillator to adjust a clock phase of the original clock signal.

18. The method of claim 10, wherein the phase difference is the difference between the phases of the data transition of the input data signal relative to an edge-sampling edge of the reference clock signal that is distanced to the data-sampling edge by 180 degrees.

* * * * *